United States Patent
Kim et al.

(10) Patent No.: US 9,112,137 B2
(45) Date of Patent: Aug. 18, 2015

(54) SEMICONDUCTOR DEVICE AND METHOD OF FABRICATING THE SAME

(75) Inventors: Jin Hyock Kim, Icheon-si (KR); Keun Lee, Icheon-si (KR); Young Seok Kwon, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 186 days.

(21) Appl. No.: 13/599,489

(22) Filed: Aug. 30, 2012

(65) Prior Publication Data
US 2013/0126815 A1    May 23, 2013

(30) Foreign Application Priority Data
Nov. 22, 2011 (KR) .................... 10-2011-0122303

(51) Int. Cl.
*H01L 45/00* (2006.01)

(52) U.S. Cl.
CPC .............. *H01L 45/06* (2013.01); *H01L 45/145* (2013.01); *H01L 45/1633* (2013.01)

(58) Field of Classification Search
CPC ............. H01L 21/3003; H01L 21/02252; H01L 21/0228; H01L 21/02315
USPC ......... 438/778, 758, 763, 762, 785, 792, 765, 438/259; 257/428, 73
See application file for complete search history.

(56) References Cited

U.S. PATENT DOCUMENTS

| | | | |
|---|---|---|---|
| 2006/0258097 A1* | 11/2006 | Forbes et al. | 438/257 |
| 2011/0204316 A1* | 8/2011 | Kreupl et al. | 257/5 |
| 2011/0210303 A1* | 9/2011 | Muraoka et al. | 257/2 |

* cited by examiner

*Primary Examiner* — Kenneth Parker
*Assistant Examiner* — Bo Fan
(74) *Attorney, Agent, or Firm* — IP & T Group LLP

(57) ABSTRACT

A semiconductor device and a method of fabricating the same are provided. The semiconductor device includes a semiconductor substrate in which a word line region is formed, and a barrier metal layer arranged on the word line region and causing a Schottky junction. The barrier metal layer includes a first nitride material, in which a first material is nitrified, and a second nitride material, in which a second material is nitrified. The barrier metal layer is formed of a mixture of the first nitride material and the second nitride material. At least one of the first material or the second material is rich in a metal used to form the first nitride material or the second nitride material.

14 Claims, 5 Drawing Sheets

SEMICONDUCTOR DEVICE AND METHOD OF FABRICATING THE SAME

CROSS-REFERENCES TO RELATED APPLICATION

This application claims priority under 35 U.S.C. 119(a) to Korean application number 10-2011-0122303, filed on Nov. 22, 2011, in the Korean Patent Office, which is incorporated by reference in its entirety.

BACKGROUND OF THE INVENTION

1. Technical Field

The inventive concept relates to a semiconductor device, and more particularly, to a semiconductor device and a method of fabricating the same.

2. Related Art

With demands on low power consumption from memory devices, next-generation memory devices with non-volatility and non-refresh have been researched. Phase-change random access memory (PCRAMs), which are examples of such next-generation memory devices, store data using a resistance difference between an amorphous state and crystalline state of a phase-change layer (e.g., a chalcogenide compound) created by an electric pulse to the phase-change layer.

In conventional PCRAMs, a MOS transistor or a PN diode is employed as a switching element. When the MOS transistor is used as the switching element, improvement in integration of the PCRAM is limited. When the PN diode is used as the switching element, a plurality of PN diodes are electrically connected to each other through an N+ region formed in a surface of an active region. Thus, driving currents of cells are different from each other due to large resistance of the N+ region. Therefore, a PCRAM having an improved design and a method a manufacturing such an improved PCRAM is necessary.

In recent years, a Schottky diode has generally been used as the switching element of the conventional PCRAM.

The conventional PCRAM employs a metal word line on a semiconductor substrate and a Schottky diode formed on the word line.

The Schottky diode includes a barrier metal layer in contact with the word line and a P+ polysilicon layer formed on the barrier metal layer.

In the conventional PCRAM employing the Schottky diode, a height of the barrier metal layer has to be increased to control an off current and a work function of the barrier metal layer has to be lowered in order to increase the height of the barrier metal layer.

When the conventional PCRAM is fabricated, metal used for the word line or the barrier metal layer may include aluminum (Al), tungsten (W), titanium nitride (TiN), or copper (Cu). However, since a subsequent thermal process is performed at a temperature of 700° C. or more, it is difficult to use a metal material such as Al or Cu. Thus TiN is typically used as the metal for the word line or the barrier metal layer.

However, TiN has large work function, for example, approximately 4.7 eV to degrade performance of the PCRAM.

SUMMARY

One or more exemplary embodiments are provided to a semiconductor device capable of enhancing reliability thereof by improving characteristics of a metal nitride layer, which is one of materials forming the semiconductor device, and a method of manufacturing the same.

According to one aspect of an exemplary embodiment, there is a provided a semiconductor device. The semiconductor device may include: a semiconductor substrate in which a word line region is formed; and a barrier metal layer, formed of a metal nitride, arranged on the word line region and causing a Schottky junction, the barrier metal layer including: a first nitride material formed of a nitrified first material; and a second nitride material formed of a nitrified second material, where the barrier metal layer is formed of a mixture of the first nitride material and the second nitride material, and where any one of the first material or the second material is rich in a metal used to form the metal nitride.

According to another aspect of an exemplary embodiment, there is a provided a semiconductor device. The semiconductor device may include: a semiconductor substrate in which a word line region is formed; and a barrier metal layer, formed of a metal nitride, arranged on the word line region and causing a Schottky junction, the word line region including a first nitride material formed of a nitrified first material; and a second nitride material formed of a nitrified second material, where the word line region is formed of a mixture of the first nitride material and the second nitride material, and where at least one of the first material or the second material is rich in a metal used to form the metal nitride.

According to another aspect of an exemplary embodiment, there is a provided a method of fabricating a semiconductor device. The method may include: providing a semiconductor substrate in which a word line region is formed; depositing a first material on the word line region; forming a first nitride material by nitrifying the first material;

determining whether the first nitride material has a desired thickness, where if the first nitride material has the desired thickness, then depositing a second material on the first nitride material, forming a second nitride material by nitrifying the second material, and determining whether the second nitride material is deposited to a desired thickness, where if the second nitride material has the desired thickness, then depositing a P+ polysilicon layer on the second nitride material, and where the first material or the second material is rich in a material used to form the first nitride material or the second nitride material.

According to another aspect of an exemplary embodiment, there is a provided a method of fabricating a semiconductor device. The semiconductor device may include: providing a semiconductor substrate; depositing a first material on the semiconductor substrate; nitrifying the first material to form a first nitride material; determining whether the first nitride material has a desired thickness, where if the first nitride material has the desired thickness, then depositing a second material on the first nitride material, nitrifying the second material to form a second nitride material, and determining whether the second nitride material is deposited to a desired thickness, where if the second nitride material has the desired thickness, then forming a barrier metal layer on the second nitride material; and depositing a P+ polysilicon layer on the barrier metal layer, where at least one of the first material and the second material is rich in a metal used to form the first nitride material or the second nitride material.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
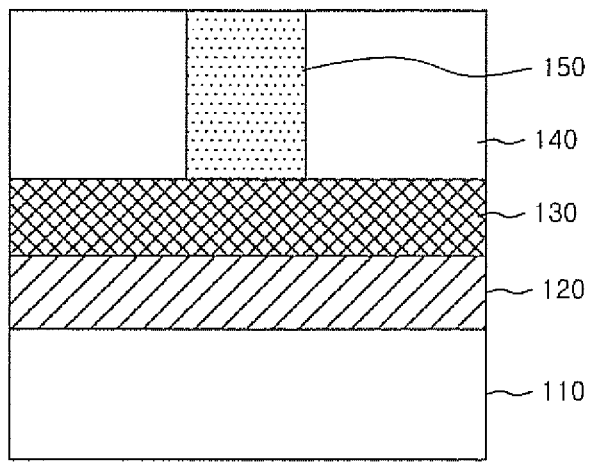
FIG. 1 is a view illustrating a portion of a semiconductor device according to an exemplary embodiment of the inventive concept.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

FIG. 1 is a view illustrating a portion of a semiconductor device according to an exemplary embodiment of the present invention.

Referring to FIG. 1, a semiconductor device 100, according to an exemplary embodiment of the present invention, includes a word line region 120. The word line region 120 includes a metal layer or a metal nitride layer formed on a semiconductor substrate 110. Here, the semiconductor device 100 may be a PCRAM.

A barrier metal layer 130, which causes a Schottky junction, includes a metal nitride layer formed on the word line region 120.

An insulating layer 140 is formed on the barrier metal layer 130 and a P+ polysilicon layer 150 is formed in the insulating layer 140 and on the barrier metal layer corresponding to each of cells.

In the above-described semiconductor device 100, the metal nitride layer, constituting the word line region 120 and the barrier metal layer 130, may be formed by mixing a first nitride material, in which a first material is nitrified, and a second nitride material in which a second material is nitrified. At least one of the first material or the second material may be rich in a metal used to form the metal nitride layer. For example, the first material may be rich in titanium (Ti) and the second material may be rich in aluminum (Al). However, the first material and second material are not limited thereto and may include any material that is capable of forming a metal nitride layer.

The reason that a composition of the metal nitride layer constituting the word line region 120 and the barrier metal layer 130 is controlled is to lower a work function thereof. In particular, when the work function of the barrier metal layer 130 is lowered, an off current can be reduced and reliability of the semiconductor device can be improved.

A method of fabricating a semiconductor device 100 according to an exemplary embodiment of the present invention will be described in detail below.

Figure 2:
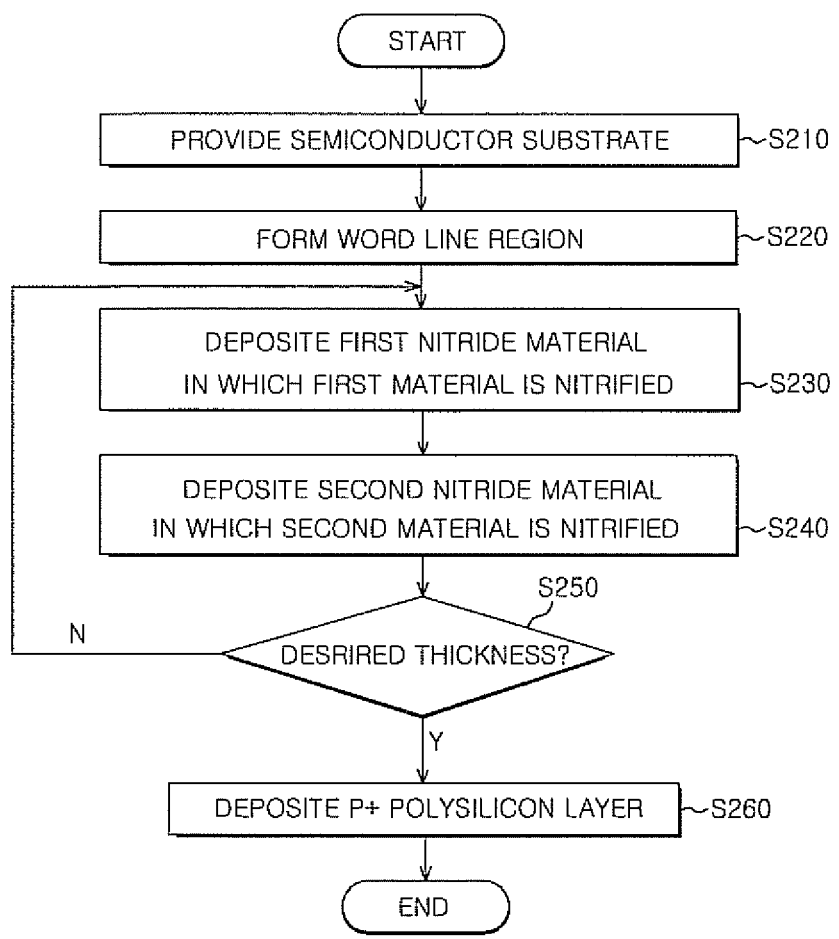
FIG. 2 is a flowchart illustrating a method of fabricating a semiconductor device according to an exemplary embodiment of the inventive concept.

FIG. 2 is a flowchart illustrating a method of fabricating a semiconductor device according to an exemplary embodiment of the present invention.

Referring to FIG. 2, a method of fabricating a semiconductor device according to an exemplary embodiment of the present invention includes providing a semiconductor substrate 110 (S210). A word line region 120, including a metal layer or a metal nitride layer, is formed on the semiconductor substrate 110 (S220).

Then, a barrier metal layer 130 is formed in the word line region 120. A method of forming the barrier metal layer 130 will now be described.

A first material is deposited and nitrified on the word line region 120 to form a first nitride material (S230). As described above, the first material may include titanium (Ti). The first nitride material may include a Ti-rich titanium nitride (Ti-rich TN) or a titanium nitride (TiN) in which Ti and N are mixed at a ratio of Ti:N of 1:1.

Then, it is determined whether or not the first nitride material is formed to a desired thickness (S240). If the first nitride material is formed to the desired thickness, then a second material is deposited and nitrified on the first nitride material to form a second nitride material (S250). As described above, the second material may include aluminum (Al). The second nitride material may include Al-rich aluminum nitride (Al-rich Al—N) or aluminum nitride (TiN) in which Al and N are mixed at a ratio of Al:N of 1:1.

Then, it is determined whether or not the second nitride material is deposited to a desired thickness (S255). If it is determined that the second nitride material is formed to the desired thicknesses, then a P+ polysilicon is deposited on the second nitride material to form a P+ polysilicon layer (S260).

If it is determined that the first nitride material or the second nitride material is not formed to the desired thicknesses, then the process of depositing the first material and nitrifying the first material to form the first nitride material (S230) or the processes of depositing the second material and nitrifying the second material to form the second nitride material (S250) is repeated until the first nitride material or the second nitride material achieves the desired thickness.

In the method of fabricating a semiconductor device according to an exemplary embodiment of the present invention, the example in which the barrier metal layer 130 includes a composition-controlled metal nitride layer has been described. However, the composition control may also be applied to the process of forming the word line region 120, as set forth below.

The metal nitride layer constituting the word line region 120 or the barrier metal layer 130 is formed through a process which will now be described in detail with reference to FIGS. 3 to 6.

Figure 3:
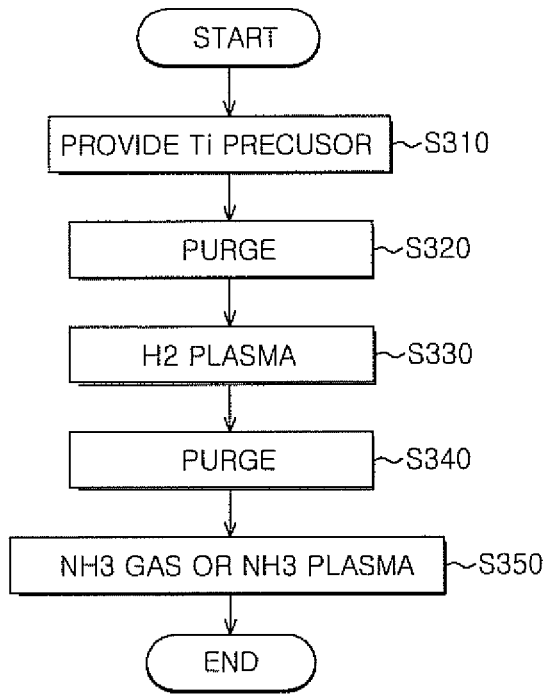
FIG. 3 is a flowchart illustrating a method of fabricating Ti-rich titanium nitride according to an exemplary embodiment of the inventive concept.

FIG. 3 is a flowchart illustrating a method of fabricating a Ti-rich titanium nitride according to an exemplary embodiment of the present invention.

In an exemplary embodiment of the present invention, the Ti-rich titanium nitride (Ti-rich TiN), may be fabricated, for example, using an atomic layer deposition (ALD) method shown in FIG. 3.

First, a titanium (Ti) precursor is provided (S310). As the titanium (Ti) precursor, Ti(NEtMe)4 (TEMATi), tetrakis (dimethylamino)titanium I (TDMATi), titanium chloride ($TiCl_4$), titanium iodide ($TiI_4$), or titanium fluoride ($TiF_4$) may be used.

Then, a purge operation is performed to exhaust impurities (S320).

A hydrogen ($H_2$) plasma process is performed to remove ligands from the titanium (Ti) precursor (S330).

Next, a purge process is performed again to exhaust impurities (S340). The above-described process of four steps S310 to S340 may be performed multiple times to form titanium (Ti) to a desired thickness, as described above.

Subsequently, an ammonia ($NH_3$) gas or plasma process is performed to nitrify the deposited titanium (Ti) (S350). A degree of nitrification of the titanium (Ti) is determined based on a partial pressure or a supply time of the $NH_3$ gas.

The Ti-rich titanium nitride (Ti-rich TiN) has a work function of around 4.3 eV to around 4.7 eV, depending on an amount of titanium (Ti) present in the Ti-rich titanium nitride (Ti-rich TiN). Therefore, the work function of the deposited Ti-rich titanium nitride (Ti-rich TiN) can be lowered by controlling the composition ratio of titanium (Ti), unlike the conventional art.

Figure 4:
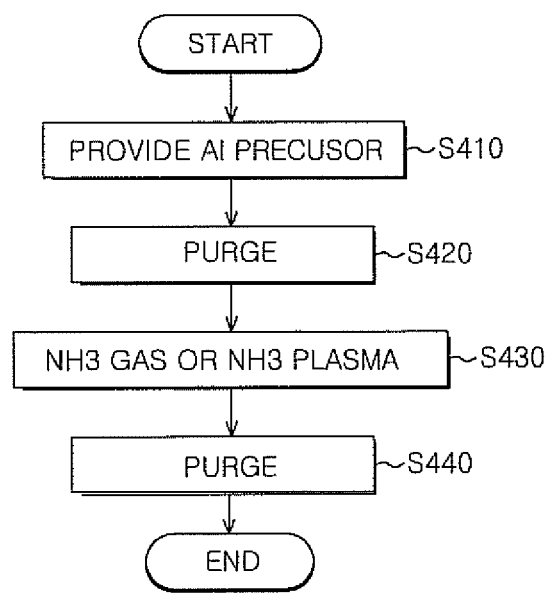
FIG. 4 is a flowchart illustrating a method of fabricating aluminum nitride according to an exemplary embodiment of the inventive concept.

FIG. 4 is a flowchart illustrating a method of fabricating aluminum nitride according to an exemplary embodiment of the present invention.

In an exemplary embodiment of the present invention, aluminum nitride (AlN) is also fabricated through an ALD method, as shown in FIG. 4.

First, an aluminum (Al) precursor is provided (S410). As the aluminum (Al) precursor, trimethylaluminum (TMA), tritertiarybutylaluminum (TBA), or aluminum chloride ($AlCl_3$) may be used. Here, aluminum (Al) has a low work function of about 4 eV to about 4.2 eV.

Then, a purge operation is performed to exhaust impurities (S420).

An $NH_3$ gas or plasma process is performed to nitrify the deposited aluminum (Al) (S430). A degree of nitrification of the aluminum (Al) is based on a partial pressure or a supply time of the $NH_3$ gas.

Next, a purge operation is performed to exhaust impurities (S440).

Figure 5:
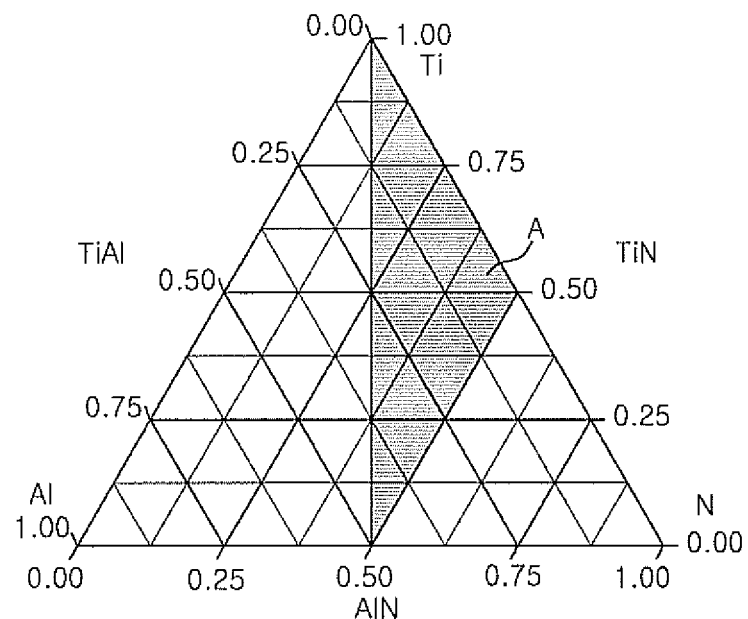
FIG. 5 is a view illustrating a composition region of Ti—Al—N formed through fabrication processes shown in FIGS. 4 and 5.

FIG. 5 shows a composition region of Ti—Al—N formed through the fabrication processes of FIGS. 3 and 4.

As shown in FIG. 5, since the metal nitride layer, according to an exemplary embodiment of the present invention, uses Ti-rich titanium nitride (Ti-rich TiN), the Ti-rich TiN has a composition ratio of titanium (Ti) of more than about 0.5 to less than 1. The content of Al:N in aluminum nitride (AlN) is 1:1, aluminum (Al) and nitrogen (N) all have a composition ratio of 0.5. Therefore, when Ti-rich TiN and AlN are mixed, the Ti—Al—N has a composition region A, as shown in FIG. 5.

Figure 6:
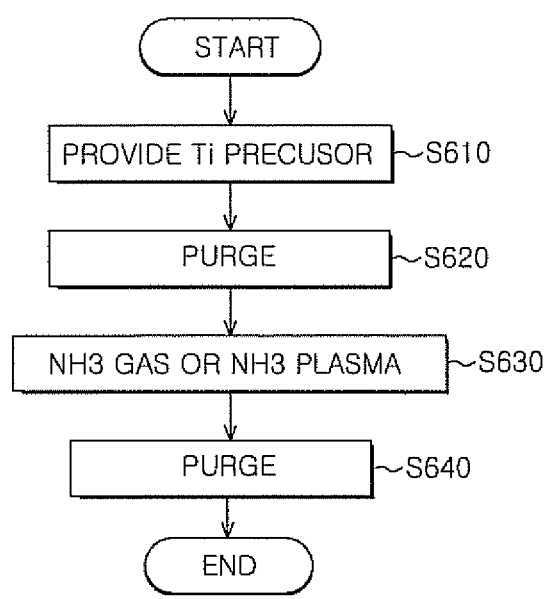
FIG. 6 is a flowchart illustrating a method of fabricating titanium nitride according to an exemplary embodiment of the inventive concept.

FIG. 6 is a flowchart illustrating a method of fabricating titanium nitride according to an exemplary embodiment of the present invention.

In an exemplary embodiment of the present invention, titanium nitride (TiN) is fabricated through an ALD method, as shown in FIG. 6.

First, a titanium (Ti) precursor is provided (S610). As the titanium (Ti) precursor, TEMATi, TDMATi, $TiCl_4$, $TiI_4$, or $TiF_4$ may be used.

A purge operation is performed to exhaust impurities (S620).

Next, an ammonia ($NH_3$) gas or plasma process is performed to nitrify the deposited titanium (Ti) (S630). The ammonia ($NH_3$) does not stoichiometrically affect a composition of titanium (Ti) and nitrogen (N), but rather, only reduces an amount of adsorbed titanium (Ti) precursor. Therefore, the $NH_3$ gas is a factor affecting the deposition rate.

A purge operation is performed again to exhaust impurities (S640).

Figure 7:
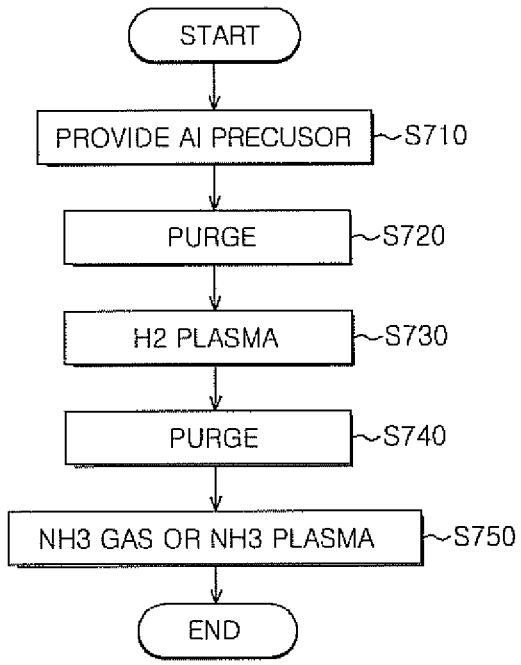
FIG. 7 is a flowchart illustrating a method of fabricating Al-rich aluminum nitride according to an exemplary embodiment of the inventive concept.

FIG. 7 is a flowchart illustrating a method of fabricating Al-rich aluminum nitride according to an exemplary embodiment of the present invention.

In an exemplary embodiment of the present invention, Al-rich aluminum nitride (Al-rich AlN) is also fabricated through an ALD method, as shown in FIG. 7.

First, an aluminum (Al) precursor is provided (S710). As the aluminum (Al) precursor, TMA, TBA, or $AlCl_3$ may be used.

Then, a purge operation is performed to exhaust impurities (S720).

A hydrogen ($H_2$) plasma process is performed to remove ligands from the aluminum (Al) precursor (S730).

Next, a purge operation is performed to exhaust impurities (S740). The above-described process of four steps S710 to S740 may be performed multiple times to deposit aluminum (Al) to a desired thickness, as described above.

Subsequently, an ammonia ($NH_3$) gas or plasma process is performed to nitrify the deposited aluminum (Al) (S750). A degree of nitrification of the aluminum (Al) is based on a partial pressure or a supply time of the $NH_3$ gas.

The Al-rich aluminum nitride (Al-rich AlN) has a work function of about 4.0 eV to about 4.2 eV. Therefore, the work function of the Al-rich aluminum nitride (Al-rich AlN) can be lowered by controlling a composition ratio of aluminum (Al), unlike the conventional art.

Figure 8:
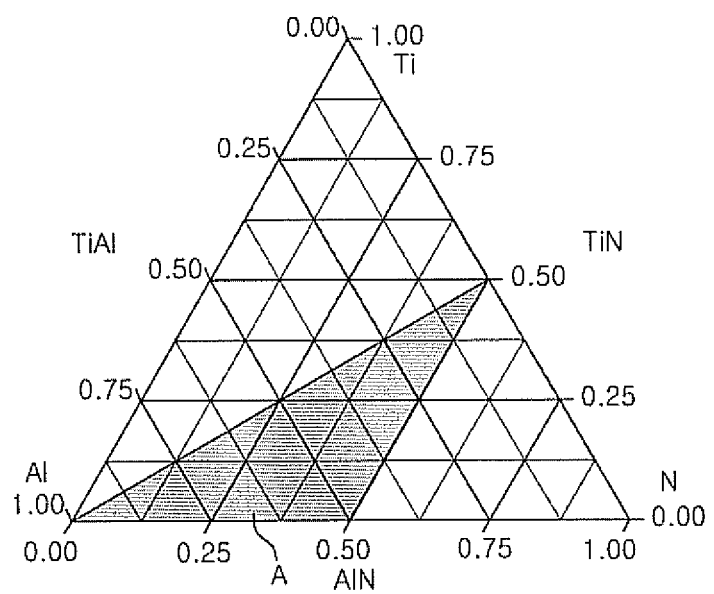
FIG. 8 is a view illustrating a composition region of Ti—Al—N formed through fabrication processes shown in FIGS. 6 and 7.

FIG. 8 shows a view illustrating a composition region of Ti—Al—N formed through the fabrication processes of FIGS. 6 and 7.

As shown in FIG. 8, since the metal nitride layer, according to an exemplary embodiment of the present invention, uses Al-rich aluminum nitride (Al-rich AlN), the Al-rich AlN has a composition ratio of aluminum (Al) of more than about 0.5 to less than 1. The content of Ti:N in TiN is 1:1, titanium (Ti) and nitrogen (N) all have a composition ratio of 0.5. Therefore, when Al-rich AlN and TiN are mixed, the Ti—Al—N has a composition region A, as shown in FIG. 8.

Figure 9:
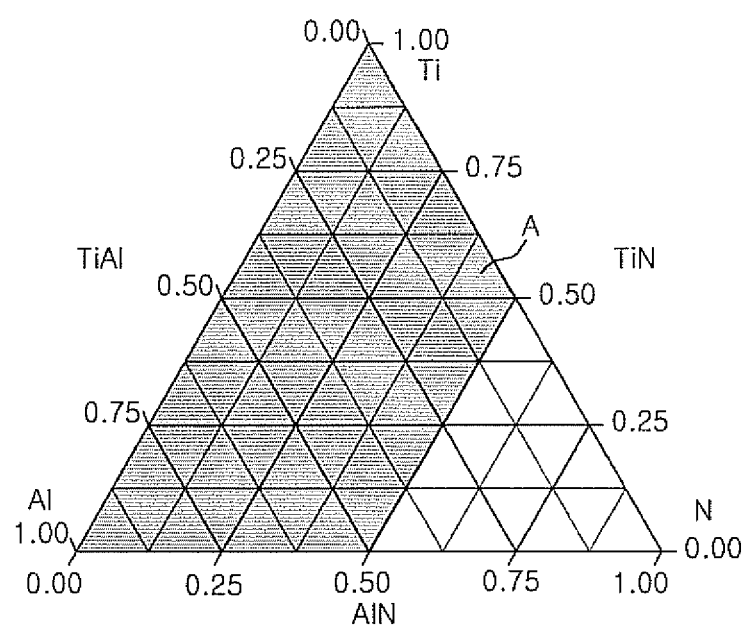
FIG. 9 is a view illustrating a composition region of Ti—Al—N formed through fabrication processes shown in FIGS. 3 and 7.

FIG. 9 is a view illustrating a composition region of Ti—Al—N formed through the fabrication processes of FIGS. 3 and 7.

As shown in FIG. 9, since the metal nitride layer, according to an exemplary embodiment of the present invention, uses TI-rich titanium nitride (Ti-rich TiN), a composition of titanium (Ti) has a composition ratio of more than about 0.5 to less than 1. Since the metal nitride layer, according to an exemplary embodiment of the present invention, uses Al-rich aluminum nitride (Al-rich AlN), a composition of aluminum (Al) has a composition ratio of more than about 0.5 to less than 1. Therefore, when Ti-rich titanium nitride (Ti-rich TiN) and Al-rich aluminum nitride (Al-rich AlN) are mixed, the Ti—Al—N has a composition region A, as shown in FIG. 9.

In particular, the metal nitride layer, described in FIG. 9, is formed by mixing Ti-rich titanium nitride (Ti-rich TiN), which has a work function that can be lowered, and Al-rich aluminum nitride (Al-rich AlN), which has a low work function. Therefore, the work function of the metal nitride layer can have a low work function, when compared with the conventional art.

The methods of fabricating a metal nitride layer according to exemplary embodiments of the present invention may be applied to a process of fabricating a multicomponent-based metal nitride layer such as Ti—Si—N, Ta—Al—N, or Ta—Si—N, in addition to Ti—Al—N.

The semiconductor device 100 and the method of fabricating the same can, according to exemplary embodiments of the present invention, lower the work function of the metal nitride layer for the word line region 120 or the barrier metal layer 130 by controlling a composition of the metal nitride layer, so that reliability of the semiconductor device can be improved.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A method of fabricating a semiconductor device, the method comprising: forming a first metal nitride film having a first metal material and a first nitride material on a word line, as a barrier metal; forming a second metal nitride film having a second metal material and a second nitride material on the first metal nitride film, as the barrier metal: and forming a conductive layer on the second metal nitride film to form a Schottky diode between the conductive layer and the barrier metal, wherein the first metal material is richer than the first nitride material in the first metal nitride film or the second metal material is richer than the second nitride material in the second metal nitride film to reduce a work function of the barrier metal, and wherein forming the first metal nitride film comprises: providing a first metal precursor on the word line; performing a purge to remove impurities; performing a hydrogen ($H_2$) process to remove ligands from the first metal material precursor; performing a second purge to remove impurities, and forming the first nitride material by nitrifying the first metal material using an ammonia $NH_3$ gas or a $NH_3$ plasma process.

2. The method of claim 1, wherein the forming the first metal nitride film comprises: repeating forming the first metal nitride film, if it is determined that the first metal nitride film does not have a desired thickness or repeating forming the second metal nitride material film, if it is determined that the second metal nitride film does not have a desired thickness.

3. The method of claim 1, wherein the first metal material is titanium and the second metal material is aluminum.

4. The method of claim 3, wherein forming the first metal nitride film and the forming the second metal nitride film are performed by an atomic layer deposition (ALD) method.

5. The method of claim 1, wherein the first metal material precursor includes any one selected from the group consisting of: $Ti(NEtMe)_4$ (TEMATi), tetrakis(dimethylamino)titanium I (TDMATi), titanium chloride (TIC14), titanium iodide (TiI4), or titanium fluoride (TiF4).

6. The method of claim 1, wherein forming the second metal nitride film comprises: providing a second metal material precursor on the first metal nitride film; performing a purge to remove impurities; performing a hydrogen ($H_2$) process to remove ligands from the second metal material precursor; performing a second purge to remove impurities; and forming the second nitride material by nitrifying the second metal material using an ammonia ($NH_3$) gas or a $NH_3$ plasma process.

7. The method of claim 6, wherein the second metal material precursor includes any one selected from the group consisting of: trimethylaluminum (TMA), tritertiarybutylaluminum (TBA), or aluminum chloride ($AlCl_3$).

8. A method of fabricating a semiconductor device, the method comprising: providing a semiconductor substrate; depositing a first metal material on the semiconductor substrate; nitrifying the first metal material to form a first metal nitride film, as a word line; determining whether the first metal nitride material film has a desired thickness, wherein if the first metal nitride film has the desired thickness then depositing a second metal material on the first metal nitride film, nitrifying the second metal material to form a second metal nitride film, as the word line, and determining whether the second metal nitride film is deposited to a desired thickness, wherein if the second metal nitride film has the desired thickness, then forming a barrier metal layer on the second metal nitride material film; and depositing a P+polysilicon layer on the barrier metal layer to form a Schottky diode, wherein the first metal material is richer than the first nitride material in the first metal nitride film or the second metal material is richer than the second nitride material, in the second metal nitride film, to be reduced a work function of the word line, wherein depositing the first metal material and nitrifying the first metal material comprises: providing a first metal material precursor on the semiconductor substrate; performing a purge to remove impurities; performing a hydrogen ($H_2$) process to remove ligands from the first metal material precursor; performing a second purge to remove impurities; and forming the first metal nitride film by nitrifying the first metal material using an ammonia ($NH_3$) gas or a $NH_3$ plasma process.

9. The method of claim 8, further comprising: repeating the depositing of the first metal material and the forming of the first nitride material, if it is determined that the first metal nitride film does not have the desired thicknesses; or repeating the depositing of the second metal material and the forming of the second first nitride material if it is determined that the second metal nitride film does not have the desired thicknesses.

10. The method of claim 8, wherein the first metal material is Titanium (Ti) and the second metal material is aluminum (Al).

11. The method of claim 10, wherein depositing the first metal material and depositing the second metal material, nitrifying the first metal material and nitrifying the second metal material are performed by an atomic layer deposition (ALD) method.

12. the method of claim 8, wherein the first material precursor includes: $Ti(NEtMe)_4$ (TEMATi), tetrakis(dimethylamino)titanium I (TDMATi), titanium chloride (TIC14), titanium iodide (TiI4), or titanium fluoride (TiF4), or a combination thereof.

13. The method of claim 8, wherein depositing the second metal material and nitrifying the second metal material comprises: providing a second metal material precursor on the first metal nitride material film; performing a purge to remove impurities; performing a hydrogen ($H_2$) process to remove ligands from the second metal material precursor; performing a second purge to remove impurities; and forming the second metal nitride film by nitrifying the second metal material using an ammonia ($NH_3$) gas or a $NH_3$ plasma process.

14. The method of claim 13, wherein the second metal material precursor includes any one selected from the group consisting of trimethylaluminum (TMA), tritertiarybutylaluminum (TBA), aluminum chloride (AlCl3), or a combination thereof.

* * * * *